United States Patent
Yang

(10) Patent No.: US 9,040,370 B2
(45) Date of Patent: May 26, 2015

(54) ANTI-FUSES ON SEMICONDUCTOR FINS

(71) Applicant: Taiwan Semiconductor Manufacturing Company, Ltd., Hsin-Chu (TW)

(72) Inventor: Hsiao-Lan Yang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/189,655

(22) Filed: Feb. 25, 2014

(65) Prior Publication Data
US 2014/0179070 A1   Jun. 26, 2014

Related U.S. Application Data

(62) Division of application No. 13/328,944, filed on Dec. 16, 2011, now Pat. No. 8,742,457.

(51) Int. Cl.
| | |
|---|---|
| *H01L 21/8234* | (2006.01) |
| *H01L 23/525* | (2006.01) |
| *H01L 27/115* | (2006.01) |
| *H01L 21/768* | (2006.01) |
| *H01L 27/10* | (2006.01) |

(52) U.S. Cl.
CPC .... *H01L 21/823475* (2013.01); *H01L 23/5252* (2013.01); *H01L 27/115* (2013.01); *H01L 21/823431* (2013.01); *H01L 21/76895* (2013.01); *H01L 27/101* (2013.01)

(58) Field of Classification Search
USPC ............... 257/183, 530, E23.147, E21.592
See application file for complete search history.

(56) References Cited

U.S. PATENT DOCUMENTS

| | | | |
|---|---|---|---|
| 8,159,040 B2 | 4/2012 | Coolbaugh et al. | |
| 2010/0202184 A1 | 8/2010 | Lee | |
| 2010/0232203 A1 | 9/2010 | Chung et al. | |
| 2012/0306002 A1 | 12/2012 | Yeh | |

FOREIGN PATENT DOCUMENTS

KR       20110016877       2/2011

*Primary Examiner* — Mamadou Diallo
(74) *Attorney, Agent, or Firm* — Slater & Matsil, L.L.P

(57) ABSTRACT

A device includes a substrate, isolation regions at a surface of the substrate, and a semiconductor region over a top surface of the isolation regions. A conductive feature is disposed over the top surface of the isolation regions, wherein the conductive feature is adjacent to the semiconductor region. A dielectric material is disposed between the conductive feature and the semiconductor region. The dielectric material, the conductive feature, and the semiconductor region form an anti-fuse.

20 Claims, 11 Drawing Sheets

ANTI-FUSES ON SEMICONDUCTOR FINS

PRIORITY CLAIM AND CROSS-REFERENCE

This application is a divisional of U.S. patent application Ser. No. 13/328,944, entitled "Anti-Fuses on Semiconductor Fins," filed on Dec. 16, 2011, which application is incorporated herein by reference.

BACKGROUND

There are two main types of data storage elements. The first type is volatile memory, in which information stored in a particular storage element is lost the moment the power is removed from the memory. The second type is non-volatile storage element, in which the information is preserved even after the power is removed. Of the second type, some designs allow multiple programming, while other designs allow only one-time programming. Typically, the manufacturing techniques used to form the non-volatile memory are different from standard logic processes. Accordingly, the complexity and the cost for forming the non-volatile memory are high.

Typically, One-Time-Programmable (OTP) memory devices include metal fuses, gate oxide fuses, etc. The metal fuses use metals as programming elements. The gate oxide fuses use gate oxides as programming elements. Existing OTP memory devices were typically fabricated using aluminum interconnect technologies, which involve the steps of aluminum deposition, patterning, and etching. The formation of these OTP memory devices is not compatible with current copper damascene processes, which have become standard processes. In addition, the existing OTP memory devices require either high voltages (such as gate oxide fuses) or high currents (such as metal and via anti-fuses) for programming. Such high voltages or high currents need to be taken into design considerations, and thus the complexity and the cost of fabricating integrated circuits increases accordingly.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

One-Time-Programmable (OTP) anti-fuses and the methods of forming the same are provided in accordance with various embodiments. The intermediate stages of forming the OTP anti-fuses are illustrated. The variations and the operation of the OTP anti-fuses in accordance with embodiments are discussed. Throughout the various views and illustrative embodiments, like reference numbers are used to designate like elements.

Figure 1:
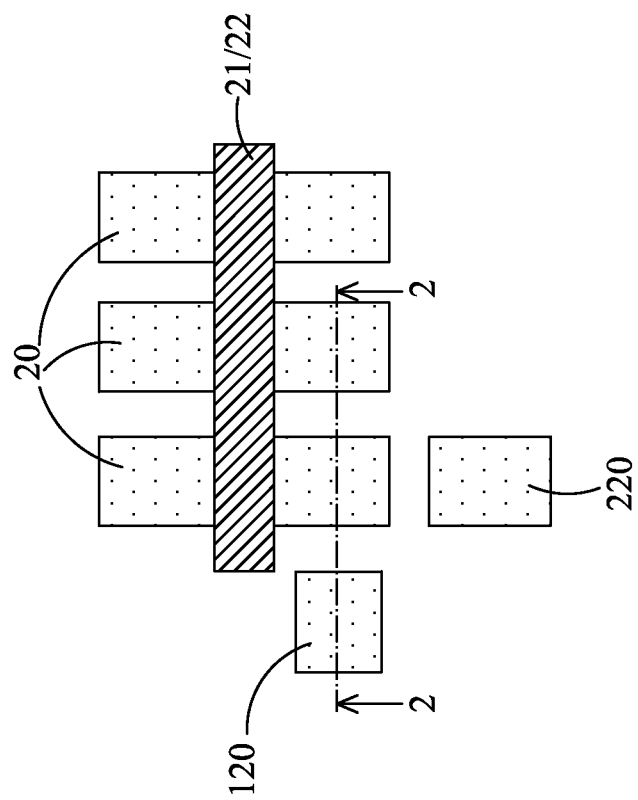
FIGS. 1 through 5 are top views and cross-sectional views of intermediate stages in the manufacturing of anti-fuses in accordance with some exemplary embodiments.

FIGS. 1 through 5 are top views and cross-sectional views of intermediate stages in the manufacturing of anti-fuses in accordance with some exemplary embodiments. FIG. 1 illustrates a top view of an initial structure for forming the anti-fuses. A plurality of semiconductor fins 20 is formed first. In some embodiments, semiconductor fins 20 are parallel to each other, and are adjacent to each other. Gate dielectric 21 and gate electrode 22 are formed over the top surfaces and sidewalls of semiconductor fins 20, with gate electrode 22 formed over, and aligned to, gate dielectric 21 (please refer to FIG. 4). The lengthwise direction of gate electrode 22 may be perpendicular to the lengthwise direction of semiconductor fins 20. Semiconductor fins 120 and 220 are disposed adjacent to semiconductor fins 20. Semiconductor fins 20, 120, and 220 may be formed of a same semiconductor material such as silicon, and may be formed simultaneously.

Figure 2:
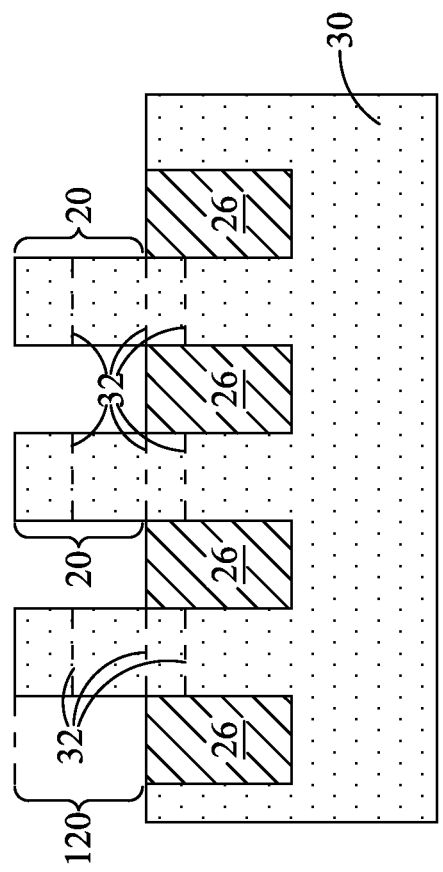

FIG. 2 illustrates a cross-sectional view of the structure in FIG. 1, wherein the cross-sectional view is taken along a plane crossing line 2-2 in FIG. 1. In accordance with some embodiments, isolation regions 26 are formed in semiconductor substrate 30. Isolation regions 26 may be Shallow Trench Isolation (STI) regions, and hence are alternatively referred to as STI regions hereinafter. Semiconductor substrate 30 may comprise silicon, silicon germanium, silicon carbon, or other semiconductor materials. Semiconductor fins 20 and 120 are over the top surfaces of STI regions 26. Semiconductor fins 20 and 120 may be formed of a same material as semiconductor substrate 30. In some embodiments, the formation of fins 20 and 120 includes forming STI regions 26 in semiconductor substrate 30, with portions of substrate 30 located between neighboring STI regions 26. STI regions 26 are then recessed, and the portion of substrate 30 that are over neighboring STI regions 26 form fins 20 and 120.

After the formation of gate dielectric 21 and gate electrode 22 over a middle section of fins 20, as shown in FIG. 1, fins 20 may be recessed. The portions of fins 20 under gate electrode 22 are protected from the recessing, while the portions of fins 20 not protected by gate electrode 22 are recessed. At the time fins 20 are recessed, fin 120 is also recessed. As shown by dashed lines 32 in FIGS. 3A and 3B, the top surfaces of fins 20 (or the top surfaces of substrate 30) and 120 after the recessing are schematically illustrated using lines 32 in FIG. 2. The top surfaces of recessed fins 20 and 120 may be higher than, level with, or lower than, the top surfaces of STI regions 26. In alternative embodiments, fins 20 and 120 are not recessed.

Figure 3A:
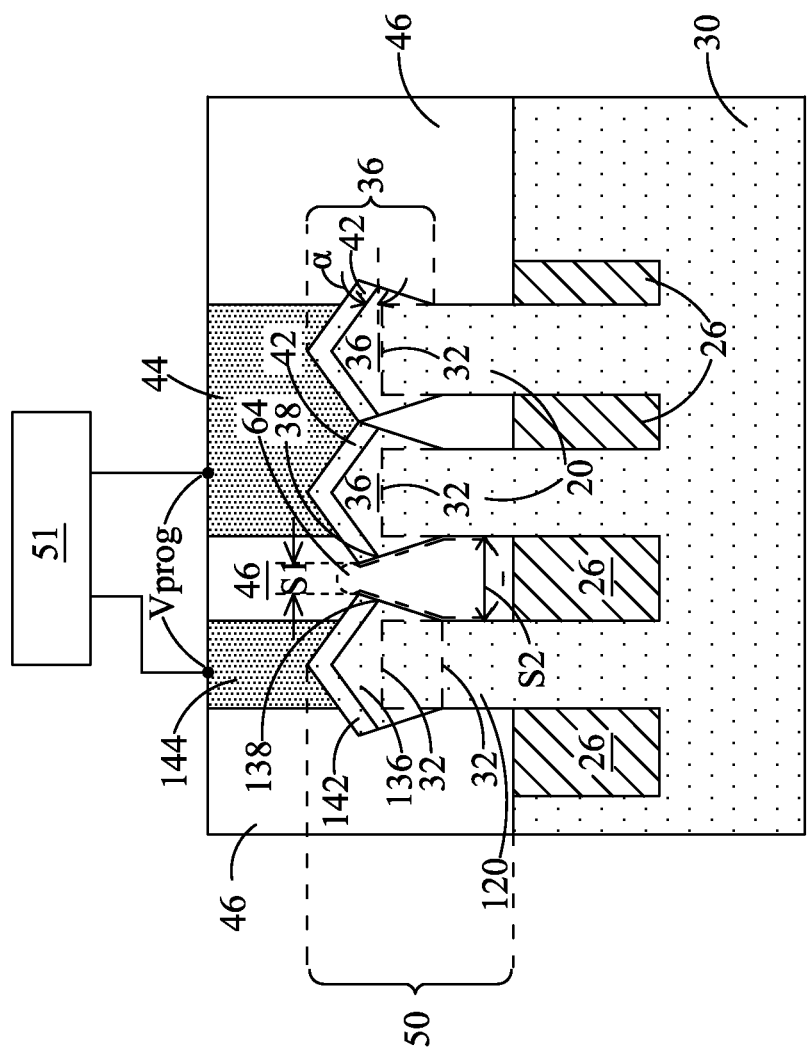
Figure 3B:
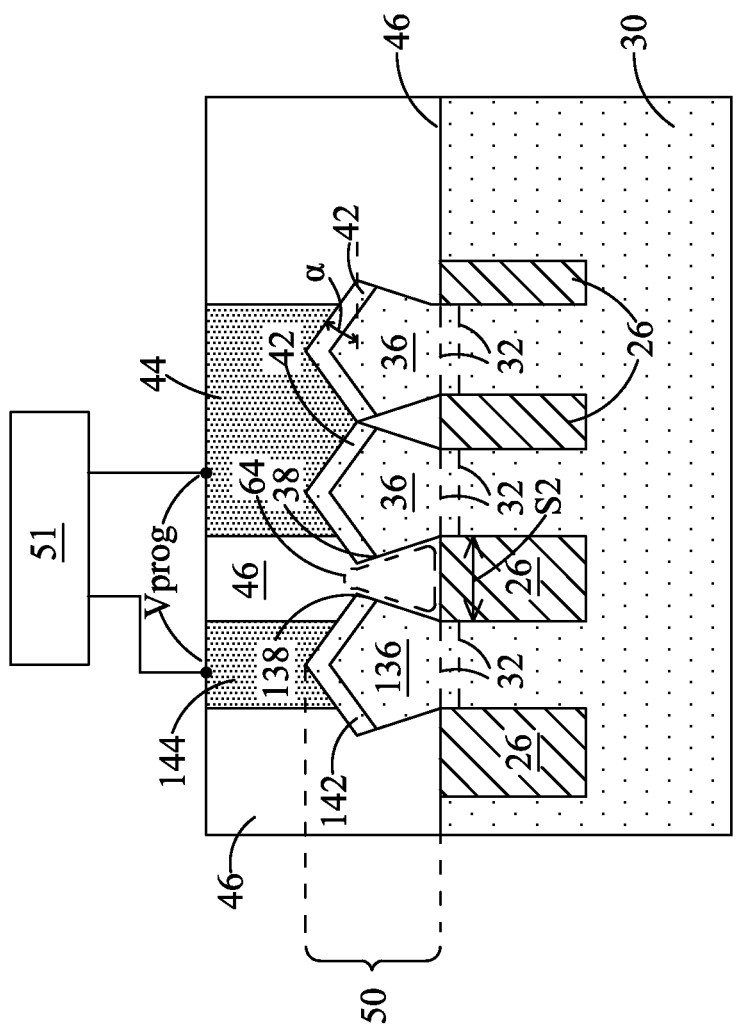

Next, as shown in FIGS. 3A and 3B, an epitaxy is performed to grow epitaxy regions 36 and 136. The epitaxy may be performed, for example, using selective epitaxial growth (SEG). FIG. 3A illustrates the embodiments wherein the recessed fins 20 and 120 have top surfaces 32 higher than the top surfaces of STI regions 26. FIG. 3B illustrates the embodiments wherein the recessed fins 20 have top surfaces 32 level with or lower than the top surfaces of STI regions 26. It is appreciated that epitaxy regions 36 and 136 also form parts of fins that are over the top surfaces of isolation regions 26. For example, in FIG. 3A, epitaxy regions 36 and 136 and the underlying remaining portions of the respective fins 20 and 120 in combination also form fins. In some embodiments, epitaxy regions 36 and 136 comprise silicon germanium. In alternative embodiments, epitaxy regions 36 and 136 comprise silicon and are substantially free from germanium. When formed of silicon germanium, the resulting epitaxy regions 36 and 136 may have a germanium atomic percentage greater than about 20 atomic percent. The germanium percentage in epitaxy regions 36 and 136 may also be between about 20 percent and about 40 atomic percent.

It is observed that due to different growth rates on different surface planes, facets may be formed, wherein the facets are slant top surfaces of epitaxy regions 36 and 136. The slant top surfaces are neither parallel nor perpendicular to the top surfaces of STI regions 26. For example, the growth rate on the surface plane having (111) surface orientations is lower than that of other planes such as (110) and (100) planes. Accordingly, epitaxy regions 36 and 136 (and epitaxy regions 236 in FIG. 4) may have facets having the (111) surface orientations (in other word, on (111) planes). The facets may have slant angle α, which may be about 54.7 degrees. Due to the formation of the facets, epitaxy region 136 may form corner 138, and epitaxy regions 36 may form corner 38. Corners 38 and 138 are close to each other, and face each other. Furthermore, epitaxy regions 36 that are grown from neighboring fins 20 may touch each other, and may merge into a large epitaxy region.

As also shown in FIGS. 3A and 3B, on top of epitaxy regions 36 and 136, silicide regions 42 and 142, respectively, are formed. Silicide regions 42 and 142 comprise the same elements in epitaxy regions 36 and 136, including silicon and/or germanium. In addition, the metal used for forming silicide regions 42 and 142 may include nickel, cobalt, palladium, and combinations thereof, although other metals suitable for forming silicide regions may also be used. Silicide regions 42 and 142 also have corners that face each other, and close to each other. Conductive features 44 and 144 are formed over, and electrically coupled to, silicide regions 42 and 142, respectively. Conductive features 44 and 144 may be contact plugs, which may comprise tungsten, for example. Alternatively, conductive features 44 and 144 may be formed of copper, and may be bottom metal features that are referred to as M0 features. Dielectric material 46 is filled in the gaps between fins 20 and 120, silicide regions 42 and 142, and conductive features 44 and 144. Dielectric material 46 may be portions of Inter-Layer Dielectric (ILD), and may comprise carbon-containing dielectric materials.

Figure 5:
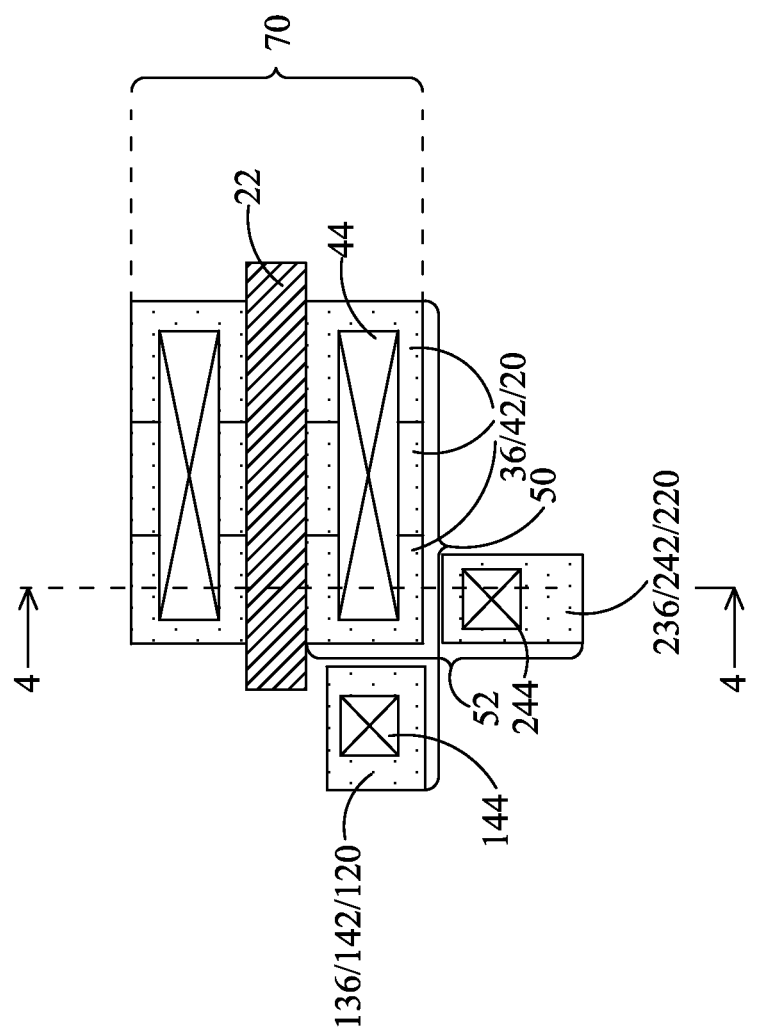

The portions of fins 20 and 120, epitaxy regions 36 and 136, silicide regions 42 and 142, and a portion of dielectric material 46 form anti-fuse 50, which may be programmed through conductive features 44 and 144. The states of anti-fuse 50 may also be read through conductive features 44 and 144. FIG. 5 illustrates a top view of anti-fuse 50 as shown in FIGS. 3A and 3B. The respective features in FIGS. 3A and 3B are marked in FIG. 5.

Referring back to FIGS. 3A and 3B, anti-fuse 50 is at a high-resistance state before being programmed. When the programming is performed, power source 51, which may be a voltage source, applies programming voltage Vprog between conductive features 44 and 144. Programming voltage Vprog may be between about +3 V and about −3 V in accordance with some exemplary embodiments. During the programming, dielectric material 46 between epitaxy regions 36 and 136 may be broken down. Accordingly, the programming turns anti-fuse 50 from a high-resistance state to a low-resistance state. The resistance of anti-fuse 50 may be measured from conductive features 44 and 144. Region 64 marks a region where dielectric material 46 is likely to break down. In some embodiments, the portion of dielectric material 46 between corners 38 and 138 (and the corners of silicide regions 42 and 142) is most likely to break down. As a result, the resistance measured between conductive features 44 and 144 is lowered. In addition, the programming may cause the melting and/or the electrical migration of silicide regions 42 and 142, and the extruding of epitaxy regions 36 and 136. The silicide in silicide regions 42 and 142 may flow into the broken-down dielectric material 46. As a result, conductive features 44 and 144 may be electrically coupled to each other through the silicide. The embodiments enable the serial of the programming mechanism, which results in the increase in the successful programming rate and the programming efficiency.

In some exemplary embodiments, before the programming, the resistance of anti-fuse 50 measured from conductive features 44 and 144 may be greater than about 1M Ohms. After the programming, the resistance of anti-fuse 50 measured from conductive features 44 and 144 may be smaller than about 100 k Ohms. Accordingly, the state of anti-fuse 50 may be read by detecting the resistance between conductive features 44 and 144. The appropriate programming voltage Vprog is related to the distance S1 between epitaxy regions 36 and 136 (and between silicide regions 42 and 142). Distance S1 is further related to distance S2 between fins 20 and 120. In some exemplary embodiments, distance S1 may be between about 35 nm and about 50 nm, and distance S2 may be between about 50 nm and about 70 nm, wherein greater distances S1 and S2 correspond to higher programming voltage Vprog. It is realized, however, that the dimensions recited throughout the description are examples, and may be changed to different values. In anti-fuse 50, the formation of the facets and tips 38 and 138 of epitaxy regions help to relax the requirement of the minimum S1 and S2 values, so that greater S1 and S2 values may be used, and anti-fuse 50 may still be programmed without requirement very high programming voltage Vprog.

Figure 4:
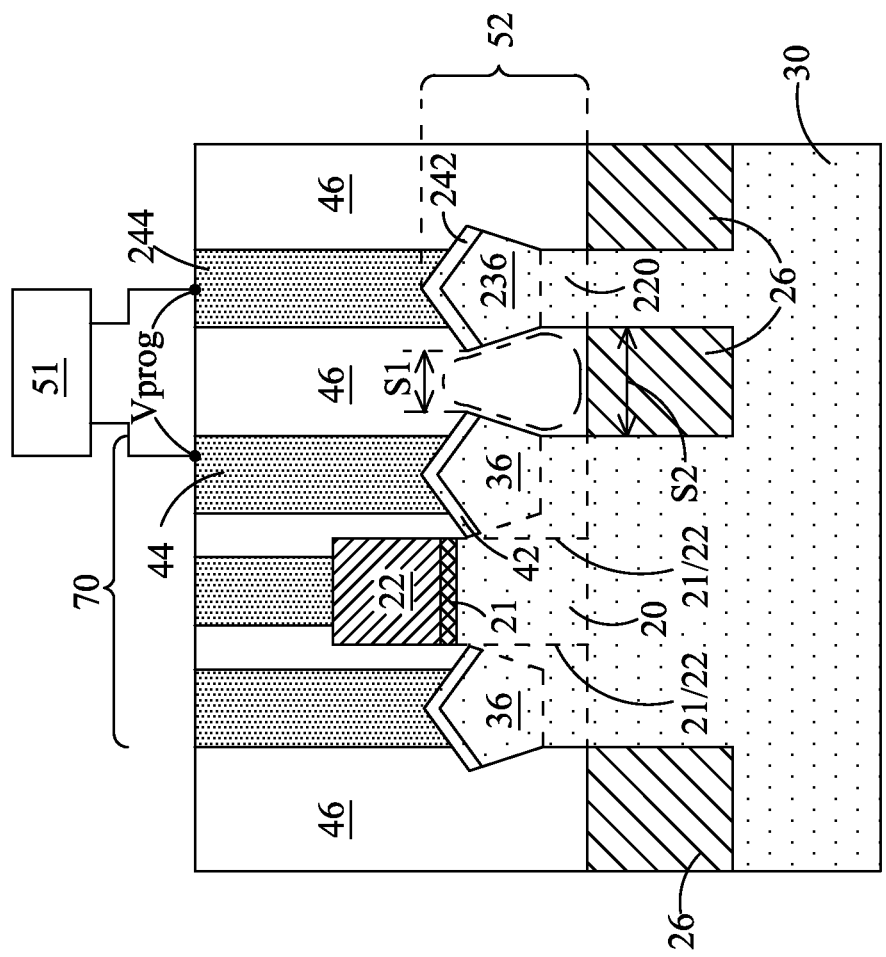

FIG. 4 illustrates the cross-sectional view of anti-fuse 52 formed between fins 20 and 220, epitaxy regions 36 and 236, silicide regions 42 and 242, and a portion of dielectric material 46 there between. The top view shown in FIG. 5 also illustrates anti-fuse 52, wherein the cross-sectional view in FIG. 4 is obtained from the plane crossing line 4-4 in FIG. 5. Referring to FIG. 4, epitaxy region 236 and silicide region 242 are formed at the same time epitaxy region 36 and silicide region 42, respectively, are formed. Anti-fuse 52 may be programmed and read through conductive features 44 and 244. The process steps, the materials, the programming and reading methods, and the like, of anti-fuse 52 may be essentially the same as the corresponding elements of anti-fuse 50, and the details may be found from the respective discussion of anti-fuse 50.

FIGS. 6 through 10 illustrate top views and cross-sectional views of intermediate stages in the formation of anti-fuses 54 and 56 (FIG. 10) in accordance with alternative embodiments. Unless specified otherwise, the materials and formation methods of the components in these embodiments are essentially the same as the like components, which are denoted by like reference numerals in the embodiment shown in FIGS. 1 through 5. The formation details of the embodiment shown in FIGS. 6 through 10 may thus be found in the discussion of the embodiments shown in FIGS. 1 through 5.

Figure 6:
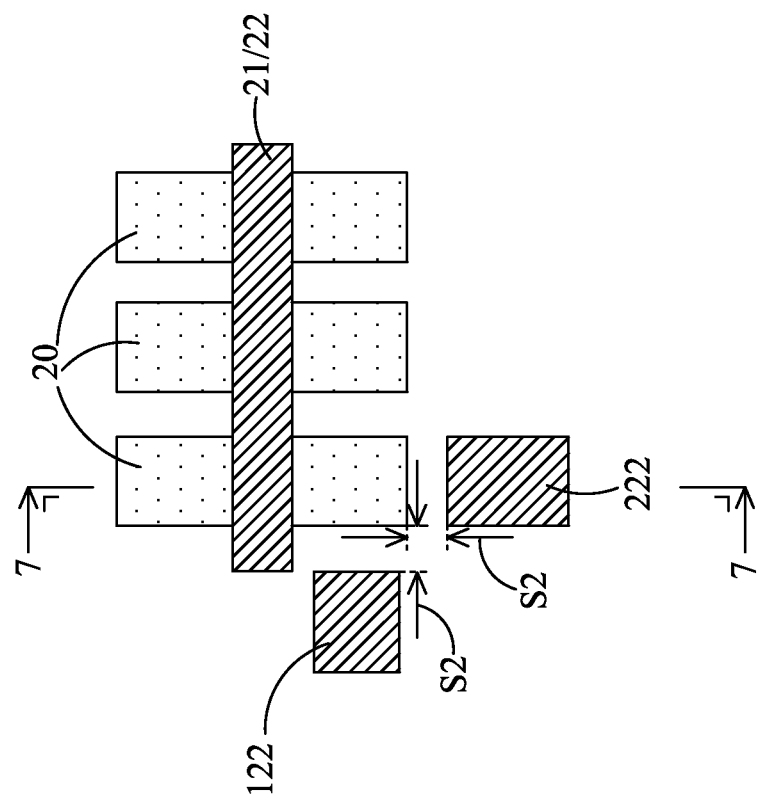
FIGS. 6 through 10 are top views and cross-sectional views of intermediate stages in the manufacturing of anti-fuses in accordance with alternative exemplary embodiments.
Figure 7:
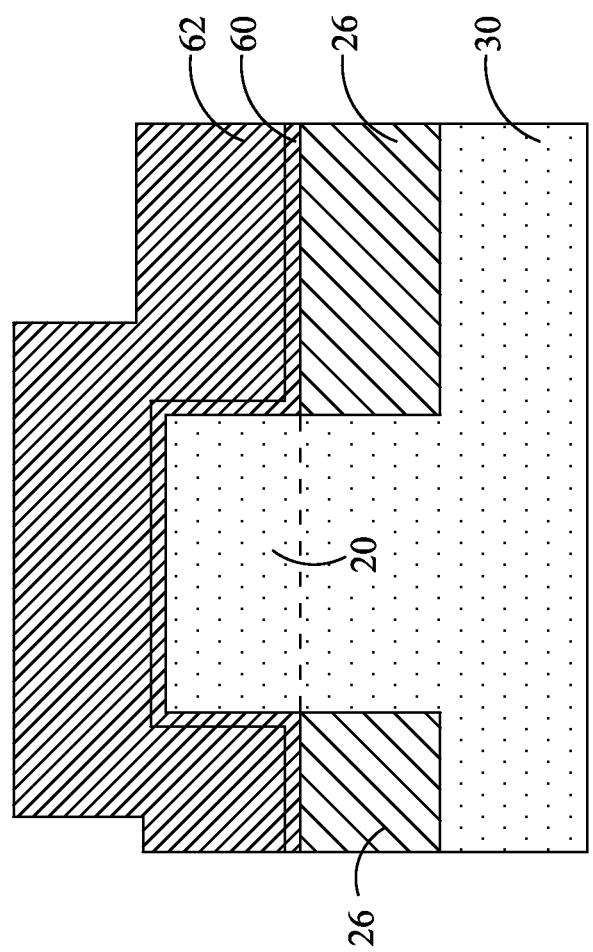
Figure 8:
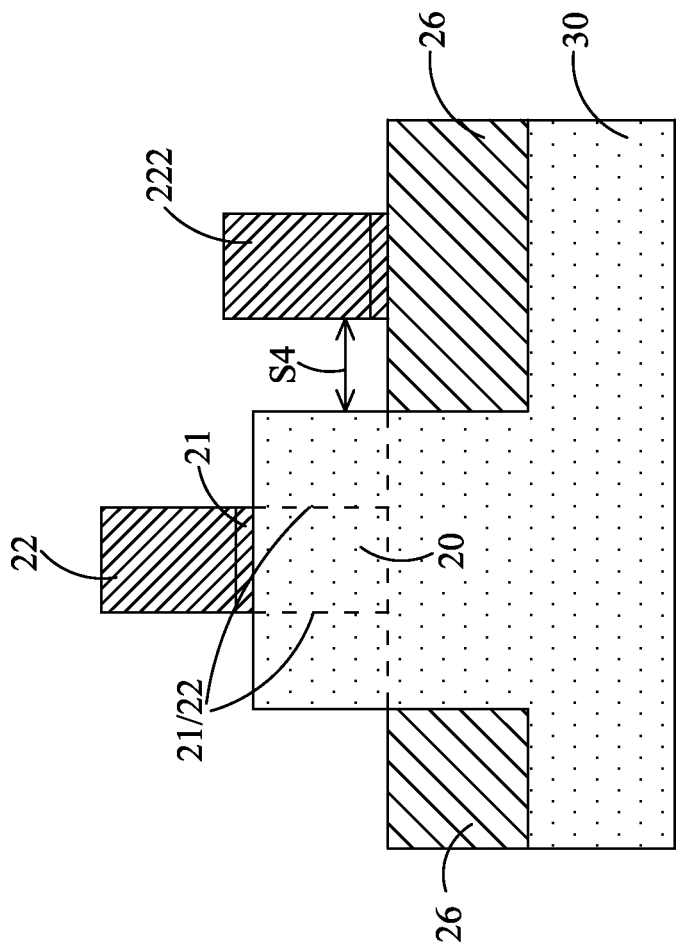

Referring to FIG. 6, fins 20, gate dielectric 21, and gate electrode 22 are formed. Conductive features 122 and 222 are also formed simultaneously when gate electrode 22 is formed. Conductive features 122 and 222 are adjacent to fins 20. The distances S2 between conductive features 122 and 222 and gate electrode 22 may be between about 50 nm and about 70 nm, for example, although different values may be used. FIGS. 7 and 8 illustrate the cross-sectional views of intermediate stages in the formation of conductive features 122 and 222 and gate electrode 22, and the formation of gate dielectric 21, wherein the cross-sectional views are obtained from the plane crossing lines 7-7 in FIG. 6. Referring to FIG.

7, gate dielectric layer 60 is formed on the top surface and sidewalls of fin 20. Gate dielectric layer 60 may comprise silicon oxide, silicon nitride, high-k dielectric materials, multi-layers thereof, and combinations thereof. Conductive layer 62 is formed over gate dielectric layer 60. Conductive layer 62 may comprise polysilicon, metals, metal silicides, or the like. Next, as shown in FIG. 8, gate dielectric layer 60 and conductive layer 62 are patterned. A remaining portion of gate dielectric layer 60 forms gate dielectric 21. The remaining portions of conductive layer 62 form gate electrode 22 and conductive feature 222. In the meantime, conductive feature 122 (FIG. 6) is also formed.

Figure 9:
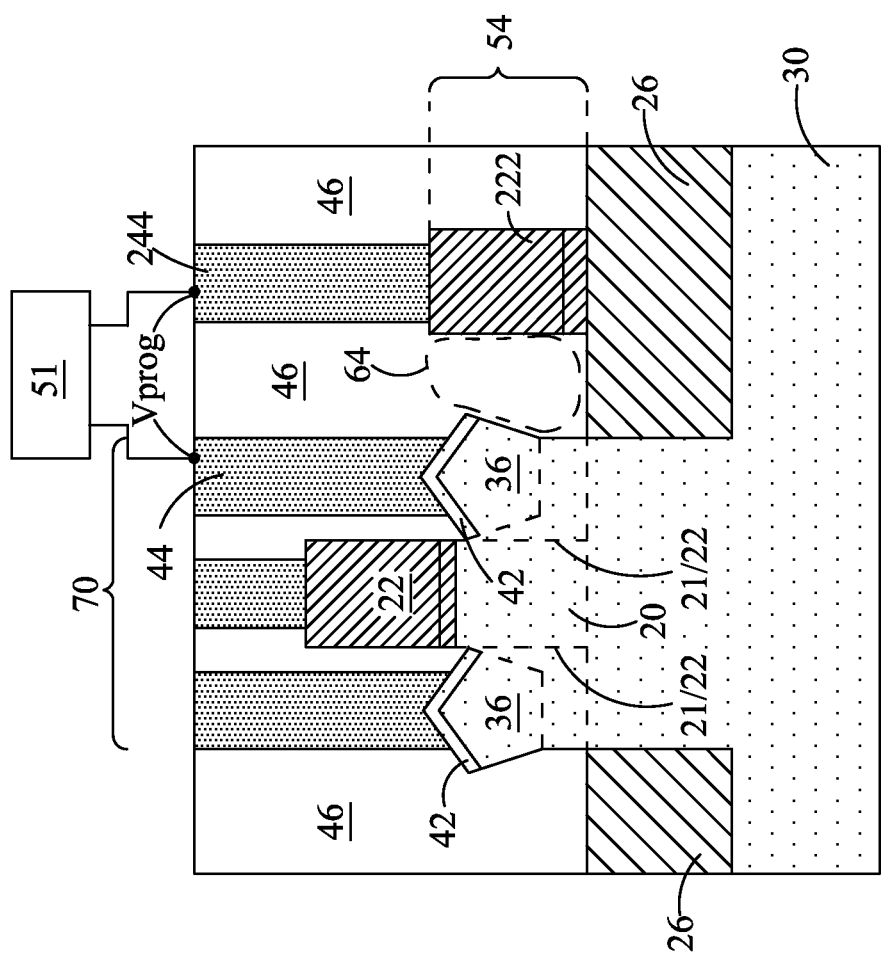
Figure 10:
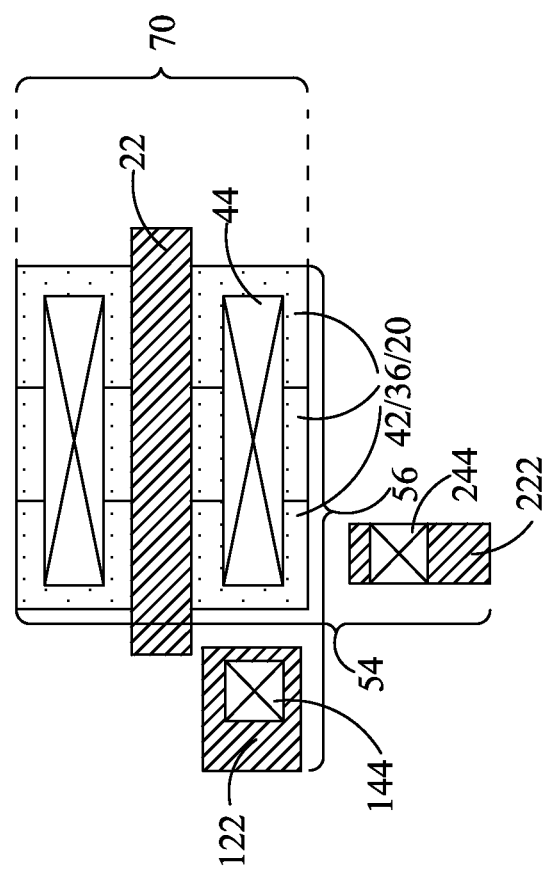

Next, as shown in FIGS. 9 and 10, epitaxy regions 36, silicide regions 42, conductive features 44 and 244, and dielectric material 46 are formed. FIG. 10 illustrates a top view of the structure in FIG. 9. The formation processes of epitaxy regions 36, silicide regions 42, conductive features 44 and 244, and dielectric material 46 may be essentially the same as in the embodiments in FIG. 3A through FIG. 5, and hence are not repeated herein. As a result, anti-fuse 54 is formed, and includes epitaxy region 36, silicide region 42, conductive feature 222, and the portion of dielectric 46 therebetween. Conductive features 44 and 244 are then formed to electrically couple to silicide region 42 and conductive feature 222, respectively. Anti-fuse 54 may be programmed by using power source 51 to apply programming voltage Vprog between conductive features 44 and 244 to break down dielectric material 46. Region 64 marks a region where dielectric material 46 is most likely to break down.

At the time anti-fuse 54 is formed, anti-fuse 56 as shown in FIG. 10 is also formed simultaneously. Anti-fuse 56 includes epitaxy region 36, silicide region 42, conductive feature 122, and the portion of dielectric 46 therebetween.

As shown in FIGS. 4, 5, 9, and 10, gate dielectric 21, gate electrode 22, and the adjacent epitaxy regions 36 may form a multi-gate transistor such as a Fin Field-Effect Transistor (FinFET). Epitaxy regions 36 may be implanted to form the source and drain regions of FinFET 70. As shown in FIGS. 4 and 5, one of the epitaxy regions 36 acts as the source/drain region of FinFET 70, and also forms a part of each of anti-fuses 50 and 52. As shown in FIGS. 9 and 10, one of the epitaxy regions 36 acts as the source/drain region of FinFET 70, and also forms a part of each of anti-fuses 54 and 56. Therefore, the formation of the anti-fuses in accordance with embodiments is fully compatible with front end processes, and no additional masks and process steps are needed. The anti-fuses may have a high density, and may be programmed using voltage, instead of laser.

In accordance with embodiments, a device includes a substrate, isolation regions at a surface of the substrate, and a semiconductor region over a top surface of the isolation regions. A conductive feature is disposed over the top surface of the isolation regions, wherein the conductive feature is adjacent to the semiconductor region. A dielectric material is disposed between the conductive feature and the semiconductor region. The dielectric material, the conductive feature, and the semiconductor region form an anti-fuse.

In accordance with other embodiments, a device includes a semiconductor substrate, STI regions at a surface of the semiconductor substrate, a first semiconductor fin over top surfaces of the STI regions, and a second semiconductor fin over the top surfaces of the STI regions. The first and the second semiconductor fins comprise facets. A dielectric material is disposed between the first and the second semiconductor fins. The dielectric material, the first semiconductor fin, and the second semiconductor fin form an anti-fuse.

In accordance with yet other embodiments, a method includes performing an epitaxy to form an epitaxy region over a top surface of an STI region, wherein the STI region is at a surface of a substrate. The method further includes forming a silicide region over and contacting the epitaxy region, forming a conductive region adjacent to the silicide region and over the STI region, and filling a dielectric material between the conductive region and a combined region of the silicide region and the epitaxy region. The conductive region, the combined region, and the dielectric material form an anti-fuse. A power source is formed to electrically couple to the silicide region and the conductive region. The power source is configured to apply a programming voltage high enough to breakdown the dielectric material.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
performing an epitaxy to form an epitaxy region over a top surface of a Shallow Trench Isolation (STI) region, wherein the STI region is at a surface of a substrate;
forming a silicide region over and contacting the epitaxy region;
forming a conductive region adjacent to the silicide region and over the STI region;
filling a dielectric material between the conductive region and a combined region of the silicide region and the epitaxy region, wherein the conductive region, the combined region, and the dielectric material form an anti-fuse; and
connecting a power source to the silicide region and the conductive region, wherein the power source is configured to apply a programming voltage high enough to program the anti-fuse.

2. The method of claim 1 further comprising:
forming a semiconductor fin over the top surface the STI region; and
recessing the semiconductor fin to form a recess, wherein the epitaxy region is formed starting from the recess.

3. The method of claim 1 further comprising:
forming a semiconductor fin over the top surface the STI region, wherein the epitaxy region is formed starting from the semiconductor fin without recessing the semiconductor fin.

4. The method of claim 3, wherein the forming the conductive region comprises:

forming a gate electrode layer over a gate dielectric layer, wherein the gate dielectric layer is over the semiconductor fin; and patterning the gate electrode layer to form a gate electrode of a multi-gate transistor and the conductive region simultaneously.

5. The method of claim 1, wherein the forming the conductive region comprises:

when the epitaxy is performed to form the epitaxy region, forming an additional epitaxy region simultaneously; and when the silicide region is formed, forming an additional silicide region over and contacting the additional epitaxy region, wherein the anti-fuse is configured to break down between a first corner of the silicide region and a second corner of the additional silicide region.

6. The method of claim 1, wherein the epitaxy region comprises facets having a (111) crystal orientation.

7. The method of claim 1, wherein the performing the epitaxy to form the epitaxy region comprises epitaxially grown a silicon germanium region.

8. The method of claim 1, wherein the power source is configured to generate a voltage high enough to break down a portion of the dielectric material between the silicide region and the conductive region or to melt the silicide region.

9. A method comprising:

epitaxially growing a first epitaxy region and a second epitaxy region, wherein corners of the epitaxy region and a second epitaxy region face each other;

forming a first silicide region over and contacting the first epitaxy region;

forming a second silicide region over and contacting the second epitaxy region;

filling a dielectric material between first silicide region and the second silicide region, wherein the first silicide region, the second silicide region, and a portion of the dielectric material in between form an anti-fuse; and connecting a power source to the first silicide region and the second silicide region, wherein the power source is configured to apply a programming voltage high enough to program the anti-fuse.

10. The method of claim 9, wherein the first epitaxy region and the second epitaxy region are formed on sidewalls and top surfaces of a first semiconductor fin and a second semiconductor fin, respectively.

11. The method of claim 10 further comprising:

forming a gate dielectric and a gate electrode on a top surface and sidewalls of the first semiconductor fin, wherein no gate dielectric and gate electrode are formed on the second semiconductor fin.

12. The method of claim 9, wherein the power source is configured to apply the programming voltage high enough to breakdown the dielectric material.

13. The method of claim 9, wherein the power source is configured to apply the programming voltage high enough to melt one of the first silicide region and the second silicide region.

14. A method comprising:

applying a programming voltage to program an anti-fuse, wherein the anti-fuse comprises:

a first semiconductor fin over top surfaces of Shallow Trench Isolation (STI) regions, wherein the first semiconductor fin comprise facets;

a first silicide region contacting the first semiconductor fin;

a conductive feature adjacent to the first semiconductor fin; and a dielectric material between the first semiconductor fin and the conductive feature, wherein the dielectric material, the first silicide region, and the conductive feature form the anti-fuse, and wherein during the applying the programming voltage, a portion of the dielectric material between the first semiconductor fin and the first silicide region are broken down.

15. The method of claim 14, wherein during the applying the programming voltage, the first silicide region is molten.

16. The method of claim 14 further comprising measuring a resistance between the first silicide region and the conductive feature to determine a state of the anti-fuse.

17. The method of claim 14, wherein the conductive feature comprises:

a second semiconductor fin over the top surfaces of the STI regions, wherein the second semiconductor fin comprise additional facets; and a second silicide region contacting the second semiconductor fin.

18. The method of claim 14, wherein the conductive feature comprises a material selected from polysilicon, a metal, and a metal silicide, and wherein the conductive feature and the first semiconductor fin and the first silicide are at a same level.

19. The method of claim 14, wherein the programming voltage is in a range between about −3V and about 3V.

20. The method of claim 16, wherein after the portion of the dielectric material is broken down, the resistance measured between the first silicide region and the conductive feature is lower than the resistance measured between the first silicide region and the conductive feature before the portion of the dielectric material is broken down.

* * * * *